(12) United States Patent
Zhu et al.

(10) Patent No.: US 10,756,760 B2
(45) Date of Patent: Aug. 25, 2020

(54) ETHERNET CONNECTION METHOD AND ETHERNET DEVICE THEREOF

(71) Applicant: REALTEK SEMICONDUCTOR CORP., Hsinchu (TW)

(72) Inventors: Jian-Yin Zhu, Jiangsu (CN); Jia-Jia Cai, Jiangsu (CN); Po-Wei Liu, Hsinchu County (TW); Chang-Lien Wu, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 89 days.

(21) Appl. No.: 16/117,444

(22) Filed: Aug. 30, 2018

(65) Prior Publication Data

US 2019/0074849 A1 Mar. 7, 2019

(30) Foreign Application Priority Data

Sep. 4, 2017 (CN) .......................... 2017 1 0785400

(51) Int. Cl.
| | |
|---|---|
| *H03M 13/09* | (2006.01) |
| *H04L 1/00* | (2006.01) |
| *H03M 13/35* | (2006.01) |
| *G06F 11/10* | (2006.01) |
| *H03M 13/15* | (2006.01) |
| *H03M 13/00* | (2006.01) |

(52) U.S. Cl.
CPC .......... *H03M 13/091* (2013.01); *G06F 11/10* (2013.01); *H03M 13/356* (2013.01); *H04L 1/0009* (2013.01); *H04L 1/0041* (2013.01); *H04L 1/0045* (2013.01); *H04L 1/0057* (2013.01); *H03M 13/152* (2013.01); *H03M 13/618* (2013.01); *H04L 1/0008* (2013.01)

(58) Field of Classification Search
CPC ..................................................... H03M 13/11
USPC ......................................................... 714/758
See application file for complete search history.

(56) References Cited

U.S. PATENT DOCUMENTS

| | | | | |
|---|---|---|---|---|
| 6,795,494 | B1 * | 9/2004 | Phanse ...................... | H04B 3/23 375/219 |
| 7,047,181 | B1 * | 5/2006 | Nemecek .............. | G06F 11/261 703/28 |
| 2001/0016021 | A1 * | 8/2001 | Chan ....................... | H04B 1/586 375/346 |
| 2002/0184550 | A1 * | 12/2002 | Chadha ................. | H04L 7/0008 713/401 |
| 2005/0152407 | A1 * | 7/2005 | Pflum .................... | H03K 5/133 370/508 |
| 2019/0190727 | A1 * | 6/2019 | LaBosco ........... | H04L 12/40045 |

* cited by examiner

*Primary Examiner* — Fritz Alphonse (74) *Attorney, Agent, or Firm* — Li & Cai Intellectual Property (USA) Office (57) ABSTRACT

An Ethernet connection method and an Ethernet device thereof are provided. The Ethernet connection method and the Ethernet device can transmit data with Error Correction Code (ECC) even with only one twisted pair or two twisted pairs when the Ethernet wire cannot transmit with the full four twisted pairs.

20 Claims, 6 Drawing Sheets

ETHERNET CONNECTION METHOD AND ETHERNET DEVICE THEREOF

CROSS-REFERENCE TO RELATED PATENT APPLICATION

This application claims the benefit of priority to China Patent Application No. 201710785400.1, filed on Sep. 4, 2017 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE INVENTION

The present disclosure relates to a wired network connection method and a network device thereof, and in particular to an Ethernet connection method and an Ethernet device thereof.

BACKGROUND OF THE INVENTION

Figure 1:
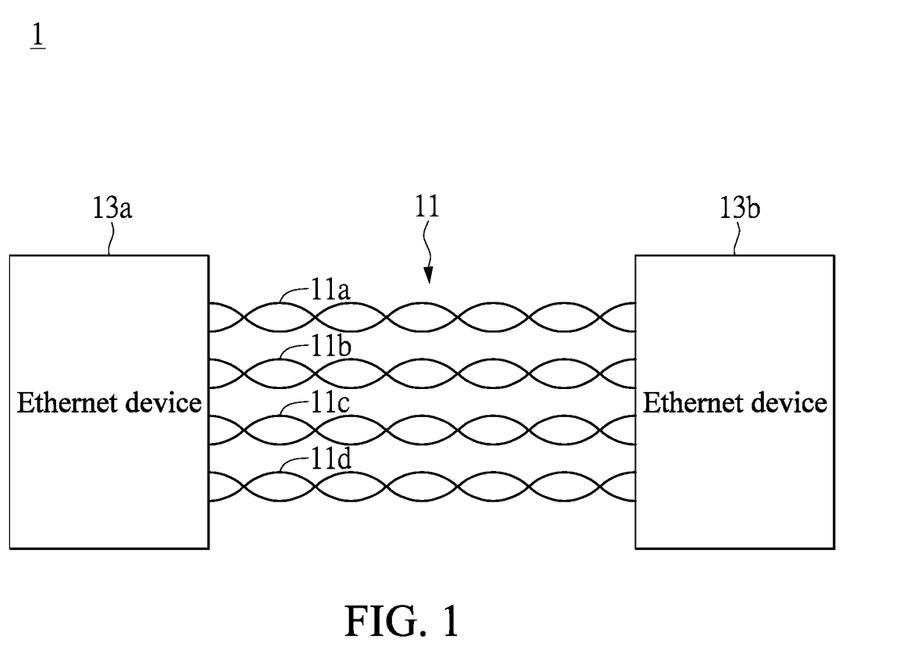
FIG. 1 shows a diagram of an Ethernet connection method according to the 1000Base-T standard.

Generally, Ethernet is connected using twisted pair cabling. According to the 1000Base-T standard, Ethernet needs four twisted pairs to operate normally. For example, reference is made to FIG. 1, which shows a diagram of an Ethernet connection method according to 1000Base-T standard. Ethernet 1 includes an Ethernet wire 11 and two Ethernet devices 13a, 13b connected to each other by the Ethernet wire 11, and the data transmission rate of each of the twisted pairs 11a-11d in the Ethernet wire 11 is 250 Mbps. Therefore, a total transmission rate of the four twisted pairs 11a-11d is 1 Gbps. However, according to the 10Base-T or the 100Base-TX standard, Ethernet 1 only needs two of the twisted pairs to operate normally, and it is thus common that only two twisted pairs capable of transmitting data are provided in the wiring of conventional carriers.

Therefore, when a user uses an Ethernet device supporting a transmission rate over 1 Gbps to connect via a conventional wiring with an Ethernet device on the other end thereof also supporting a transmission rate over 1 Gbps, since an additional two twisted pairs are not included in the conventional wiring and it is not matching the 1000Base-T standard, these two Ethernet devices with transmission rate over 1 Gbps are limited by an inadequate number of usable twisted pairs. Accordingly, experience connection is failure and forced to use the 100Base-TX/10Base-T standards to transmit data such that the performance of the two Ethernet devices is affected.

SUMMARY OF THE INVENTION

Therefore, an object of the present disclosure is to provide an Ethernet connection method and an Ethernet device thereof. The connection method and the Ethernet device may be applied to provide a connection mechanism when there are only one or two twisted pairs capable of transmitting data in an Ethernet wire to prevent connection failure or being forced to transmit data according to the 100Base-TX/10Base-T standards.

An embodiment of the present disclosure provides an Ethernet connection method used for an Ethernet device having a media access control layer and a physical layer. The connection method includes setting the Ethernet device to operate in a first connection mode or a second connection mode. The first connection mode uses four twisted pairs of an Ethernet wire, and the second connection mode only uses one twisted pair or two twisted pairs of the Ethernet wire. When the Ethernet device operates in the second connection mode, an error correction code (ECC) mechanism is added between the media access control layer and the physical layer.

An embodiment of the present disclosure provides an Ethernet device. The Ethernet device is connected to a remote network device by an Ethernet wire. The Ethernet device includes a first transceiver, a second transceiver and a controller. The first transceiver is coupled to a first twisted pair on the Ethernet wire. The second transceiver coupled to a second twisted pair on the Ethernet wire. The controller is used for setting the Ethernet device to operate in a first connection mode or a second connection mode. Four twisted pairs of the Ethernet wire are used in the first connection mode, and only the first twisted pair and/or the second twisted pair of the Ethernet wire are used in the second connection mode. When the Ethernet device operates in the second connection mode, an error correction code mechanism is added between a media access control layer and a physical layer of the Ethernet device.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of an Ethernet connection method and an Ethernet device thereof according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

Figure 2A:
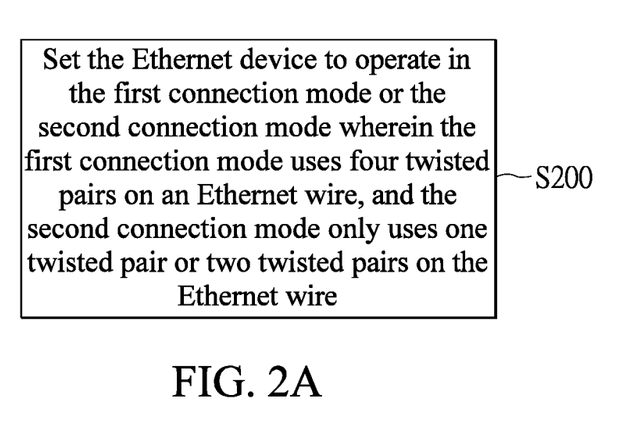
FIG. 2A shows a flowchart of an Ethernet connection method according to an embodiment of the present disclosure.
Figure 3:
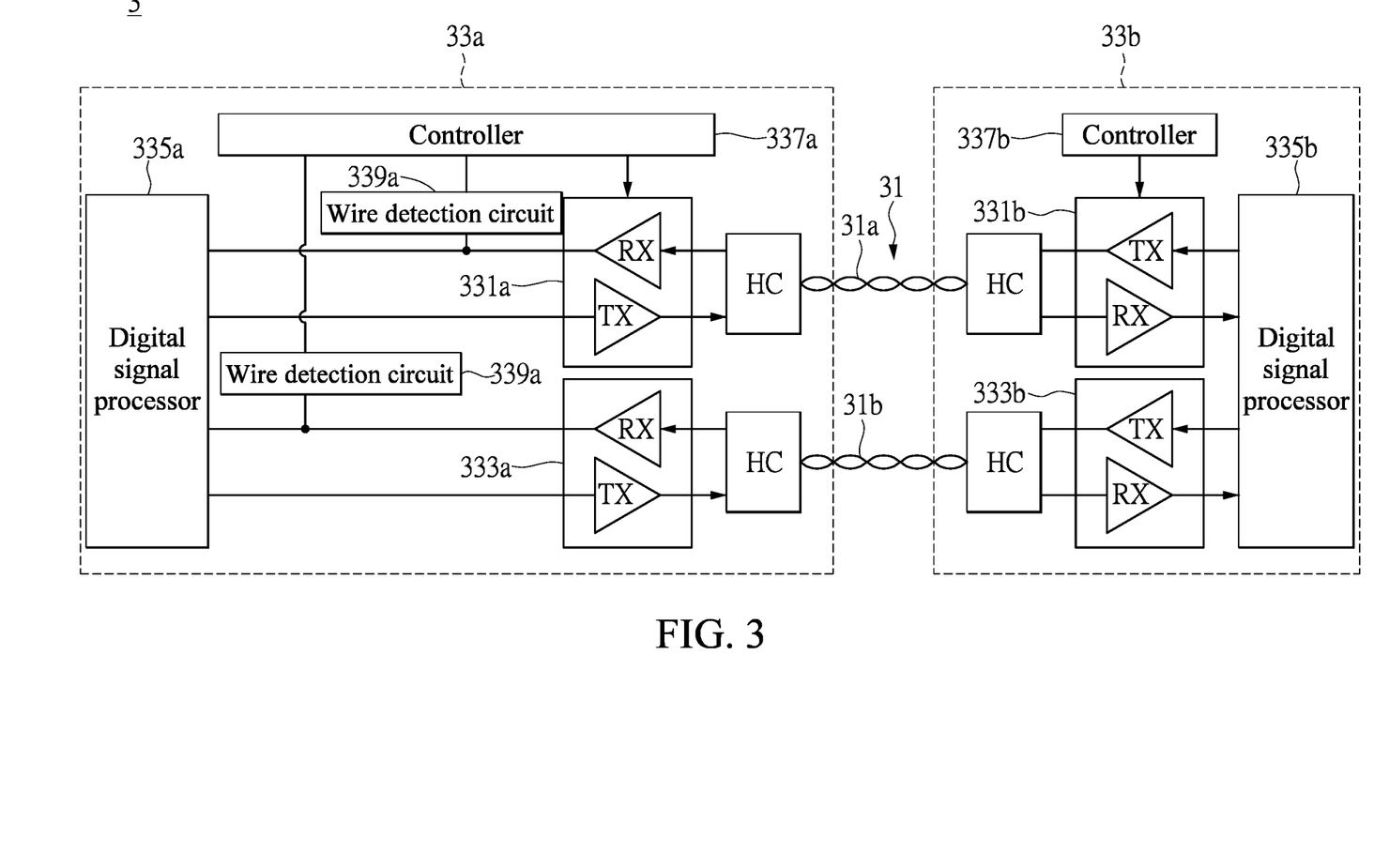
FIG. 3 shows a functional block diagram of the PHY layer of an Ethernet device according to an embodiment of the present disclosure.

First, reference is made to both FIG. 2A and FIG. 3. FIG. 2A shows a flowchart of an Ethernet connection method according to an embodiment of the present disclosure, and FIG. 3 shows a block diagram of function of an Ethernet device according to an embodiment of the present disclosure. The Ethernet connection method in FIG. 2A may be applied to Ethernet devices 33a, 33b in FIG. 3, but the Ethernet connection method in FIG. 2A is not limited to being only applied to the Ethernet devices 33a, 33b in FIG. 3 in the present disclosure. In addition, the Ethernet devices 33a, 33b in FIG. 3 are only one implementation of the Ethernet connection method, and the present disclosure is not limited thereto.

In the embodiment, an Ethernet 3 includes an Ethernet wire 31 and two Ethernet devices 33a, 33b connected to each other by the Ethernet wire 31. Under normal circumstances, an Ethernet wire should include four twisted pairs as shown at the Ethernet wire 11 in FIG. 1, however, the Ethernet wire 31 in FIG. 3 only includes two twisted pairs 31a-31b compared thereto. Therefore, it should be known that, the Ethernet connection method and the Ethernet device thereof provided by the embodiment of the present disclosure may be applied to wirings with only two twisted pairs in conventional carriers, or applied under some particular conditions. For example, when there is a defect in the twisted pairs of the Ethernet wire, the original Ethernet wire with four twisted pairs is able to transmit data only with one twisted pair or two twisted pairs. Furthermore, in practice, the Ethernet device 33a can exemplarily be a master device (such as a switch) at a local terminal, and the Ethernet device 33b can exemplarily be a slave network device (such as an NIC) at a remote terminal, but the present disclosure is not limited thereto.

The Ethernet device 33a is exemplified for description convenience in the following. In addition, elements in the Ethernet device 33b similar to those of the Ethernet device 33a are labeled with equal or similar reference numerals, thus further description thereon will be omitted herein.

As shown in FIG. 3, the Ethernet device 33a includes at least two transceivers (for example, the first and second transceiver 331a, 333a in FIG. 3) respectively consisting of a receiving unit RX and a transmitting unit TX, a digital signal processor (DSP) 335a, a controller 337a, and a hybrid circuit HC coupled to each set of the transceivers. The first transceiver 331a is coupled to a first twisted pair (for example, twisted pair 31a) through the hybrid circuit HC, and the second transceiver 333a is also coupled to a second twisted pair (for example, a twisted pair 31b) on the Ethernet wire 31 through the hybrid circuit HC.

In addition, a digital signal processor 335a is used for connecting a receiving unit RX and a transmitting unit TX in the first and second transceivers 331a, 333a, processing data (not shown) received from the receiving units RX, and processing data (not shown) sent from the transmitting units TX. However, the working principle of the first transceiver 331a, the second transceiver 333a, the digital signal processor 335a and the hybrid circuit HC are known by a person of ordinary skill in the art, and further description of the elements mentioned above will be omitted herein.

In the embodiment, a controller 337a is used for setting the Ethernet device 33a to operate in a first connection mode or a second connection mode. The first connection mode uses four twisted pairs of the Ethernet wire 31, and the second connection mode uses one twisted pair or two twisted pairs on the Ethernet wire 31 only. In the present disclosure, an initial connection mode set by the controller 337a is not limited to be the first connection mode. In other words, a person of ordinary skill in the art may determine the Ethernet device 33a to use the first or second connection mode as an initial connection mode according to a practical requirement or application. Accordingly, in the connection method of FIG. 2A, step S200 is setting the Ethernet device 33a to operate in the first connection mode or the second connection mode.

In practice, however, since a number of the twisted pairs used by the Ethernet wire 31 is presumed as unknown, and the connection method needs four twisted pairs according to the conventional 1000Base-T standard, when the Ethernet device 33a connects with the Ethernet device 33b, the Ethernet devices 33a, 33b usually undergo an auto-negotiation mechanism through two twisted pairs to exchange connection capabilities with each other. The controller 337a of the Ethernet device 33a then sets the Ethernet device 33a to prioritize operating in the first connection mode. Next, as shown in FIG. 3, since only two twisted pairs (i.e., twisted pairs 31a and 31b) may be used by the Ethernet wire 31 in the first connection mode, the controller 337a may further determine whether to reset the Ethernet device 33a according to a connection status to make the Ethernet 33a operate in the second connection mode.

It should be noted that, in the embodiment, the connection status may be, for example, a number of failed connections of the Ethernet device 33a, but the present disclosure is not limited thereto. Therefore, it should be known that, when the number of the failed connections of the Ethernet device 33a is greater than a predetermined number, for example, when the number is 3 or 4, the controller 337a may determine to make the Ethernet device 33a operate in the second connection mode. In a different embodiment, the connection status is obtained through an auto-negotiation process. The auto-negotiation process is that when the resolved connection status corresponds to one twisted pair or two twisted pairs of the Ethernet wire 31, the Ethernet device 33a is determined to operate in the second connection mode. In another embodiment, the connection status is obtained through a signal detection on the Ethernet wire 31, and when no valid signal on any one of the four twisted pairs of the Ethernet wire 31 is detected, the controller 337a may determine to make the Ethernet device 33a operate in the second connection mode.

In addition, details on obtaining the connection capabilities of the Ethernet devices 33a, 33b of the present disclosure are further described in the following. For example, in an application of the present embodiment, before the Ethernet device 33a connects with the Ethernet device 33b, the controller 337a of the Ethernet device 33a will control the first and second transceiver 331a, 333a to undergo an auto-negotiation mechanism to confirm the connection capabilities of the Ethernet devices 33a, 33b. In the embodiment, one exemplary implementation of the auto-negotiation mechanism is using link pulses sent between two twisted pairs 31a-31b on the Ethernet wire 31 to confirm the connection capabilities of the Ethernet devices 33a, 33b. For example, the two Ethernet devices 33a, 33b may use a conventional N-way technology to obtain the connection capabilities of each other. The implementation of the connection of the Ethernet devices 33a, 33b is only an example and should not be taken as limitation in the scope of the present disclosure.

The four twisted pairs of the Ethernet wire 31 are used in the first connection mode so that when the connection capabilities of the two Ethernet devices 33a, 33b both support the 2.5 GBase-T standard, a transmission rate of the first connection mode may be, for example, 2.5 Gbps, but the present disclosure is not limited thereto. Next, details of the controller 337a of the present disclosure determining one twisted pair or two twisted pairs of the Ethernet wire 31 to be used in the second connection mode is further described in the following. It should be noted that, details of the implementation applied in the following is only an example, and should not be taken as limiting the scope of the present disclosure.

In one application of the present disclosure, when the controller 337a of the Ethernet device 33a determines to reset the Ethernet device 33a to operate in the second connection mode, the controller 337a may control the first and second transceivers 331a, 333a to undergo a wire detection mechanism to determine one twisted pair or two twisted pairs of the Ethernet wire 31 to be used in the second connection mode. In the embodiment, the wire detection mechanism is preferably realized by using a wire detection circuit 339a connected to each of the receiving units RX and making the transmitting units to transmit a detection signal (not shown), and detecting if there is any signal reflected back on each of the twisted pairs 31i (i.e., "i" is a or b). If a signal is reflected back, it means that the signal cannot be transmitted by the twisted pairs 31i, and thus the twisted pairs 31i may be determined to be not provisioned or in an unconnectable state.

Alternatively, a controller 337b of the Ethernet device 33b can detect whether a valid signal from each twisted pairs 31i is received, and if no valid signal from the twisted pairs 31i is received, then it may be determined that the twisted pairs 31i are not provisioned or in an unconnectable state. According to the wire detection mechanism mentioned above, the controllers 337a, 337b of the two Ethernet devices 33a, 33b may thus obtain a number of twisted pairs able to be used in the Ethernet wire 31. In detail, although the Ethernet wire 31 may provide the two twisted pairs 31a, 31b, one of the two twisted pairs may be damaged due to inappropriate operation or poor quality, so that the twisted pairs may be unable to perform the connection normally.

Therefore, if both of the two twisted pairs 31a, 31b may perform a connection operation normally according to the wire detection mechanism, the two Ethernet devices 33a, 33b operating in the second connection mode may be connected through the two twisted pairs 31a, 31b by a compromise between the two Ethernet devices 33a, 33b, and the data transmission rates of the two twisted pairs 31a, 31b are respectively 625 Mbps to achieve a total transmission rate of 1.25 Gbps in the second connection mode.

Similarly, if only one twisted pair 31i may perform a connection operation normally according to the wire detection mechanism, the two Ethernet devices 33a, 33b operating in the second connection mode may be connected through only one twisted pair 31i by a compromise between the Ethernet devices 33a, 33b, and the data transmission rate of the two twisted pairs 31i is 625 Mbps to make connection possible. Similarly, even if both of the two twisted pairs 31a, 31b in the Ethernet wire 31 may perform a connection operation normally, the two Ethernet devices 33a, 33b operating in the second connection mode may still be connected through one twisted pair 31i in the Ethernet wire 31 by a compromise between the two Ethernet devices 33a, 33b so as to save the usage of another twisted pair.

Figure 2B:
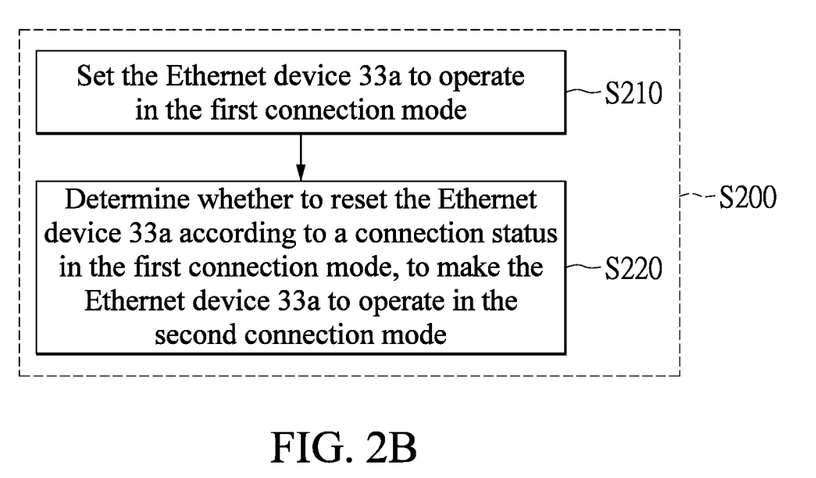
FIG. 2B is a flowchart of the Ethernet connection method showing the Ethernet device being set to operate in a first or second connection mode in FIG. 2A.

That is, with additional reference to FIG. 2B, the actual implementation of step S200 in FIG. 2A, i.e., setting the Ethernet device 33a to operate in the first or second connection mode can include the following steps. First, in step S210, the Ethernet device 33a is set to operate in the first connection mode. Next, in step S220, in the first connection mode, it is determined whether to reset the Ethernet device 33a according to a connection status to make the Ethernet device 33a operate in the second connection mode.

In addition, according to another embodiment, in step S200 in FIG. 2A, the Ethernet device 33a can be directly set to be in the second connection mode in the initial mode by software or firmware to decrease the total setting time. As there are a number of embodiments that disclose the setting method of the connection between the Ethernet devices 33a, 33b, further details will be omitted herein.

Therefore, as mentioned above, it can be appreciated by a person of ordinary skill in the art that, the main object of the embodiment is to use only one twisted pair or two twisted pairs in the second connection mode to transmit data when the Ethernet wire cannot use the full four twisted pairs. However, since the data transmission rate in the second connection mode is exemplified as 1.25 Gbps, as many as four twisted pairs need be used to achieve a transmission rate of more than 1 Gbps in the prior art. The present disclosure may use the existing wiring with two twisted pairs to obtain connection with a transmission rate of more than 1 Gbps so that the issues of the transmission rate has to be decreased to 10 M or 100 M, or disconnection problem may be solved.

On the other hand, by the operation mentioned above, the original wiring only achieving bandwidths of 10 M/100 M may be improved to achieve bandwidths of more than 1000 M. Therefore, the present disclosure can also efficiently increase the used bandwidth. In addition, when the two Ethernet devices 33a, 33b still operate in the second connection mode, if the Ethernet wire 31 is changed to include four twisted pairs in FIG. 3, the other two unused twisted pairs in the second connection mode may be shared to another two Ethernet devices similar to the usage of the two Ethernet devices 33a, 33b. Therefore, the present disclosure further provides two routes having bandwidths of more than 1000 M to satisfy particular requirements of certain applications thereof.

On the other hand, for the Ethernet device 33a operating with the transmission rate of 1.25 Gbps (i.e., in the second connection mode), the transmission rate of an interface (for example, XGMII) between a physical coding sublayer (PCS) of a physical layer (PHY) and a medium access control layer (MAC) is also 1.25 Gbps. However, since the effective data rate of the MAC is only 1 Gbps, there is a redundant bandwidth of 0.25 Gbps on the PHY. In other words, when a packet of MAC is sent to the PCS, adding a redundant data at the rate of 0.25 Gbps to the packet is required to increase the rate from 1 Gbps to 1.25 Gbps, and before the packet from the PCS is sent to the MAC, the redundant data with a rate of 0.25 Gbps needs to be removed from the packet to decrease the rate from 1.25 Gbps to 1 Gbps.

In this condition, a bandwidth of 0.25 Gbps between the MAC and the PHY may be wasted. Therefore, another object of the present disclosure is to provide a method to improve a packet between the PHY and the MAC. The method of improving the packet may be applied to a situation when the Ethernet device 33a operates in the second connection mode. Accordingly, an error correction code mechanism can be added between the PHY and the MAC to fully utilize the redundant bandwidth. In detail, reference is also made to FIG. 4, which shows a block diagram of the Ethernet device in FIG. 3 being mapped to an open system interconnection (OSI) reference model. Note that, the medium access control layer is also known as a data link layer (Data Link) in the OSI reference model. Since details regarding the OSI reference model is known to a person having ordinary skill in the art, further description of the PHY 341a, 341b and the MAC 343a, 343b in the OSI reference model will be omitted herein.

Figure 4:
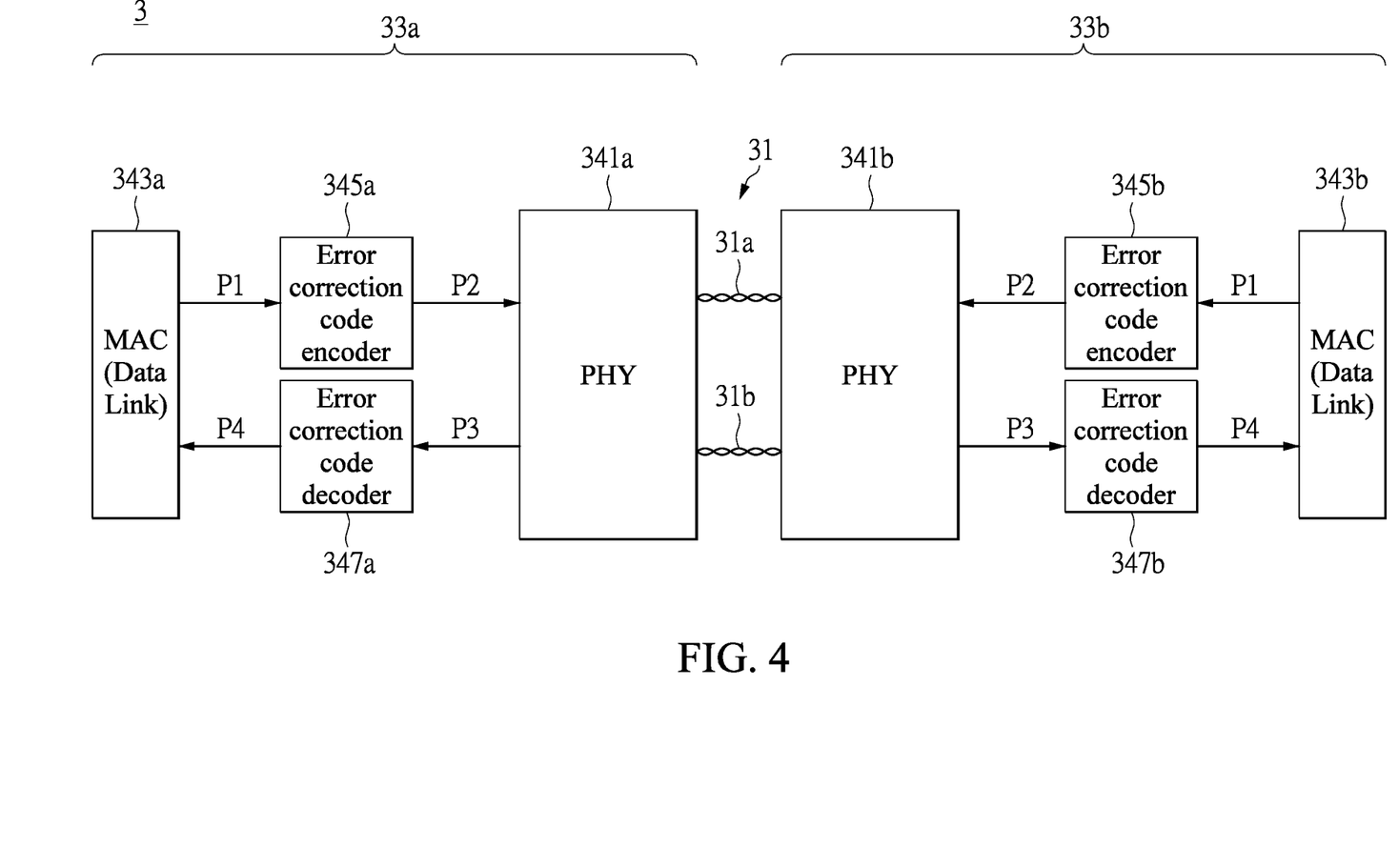
FIG. 4 shows a schematic diagram illustrating the Ethernet device in FIG. 3 being mapped to an open system interconnection (OSI) reference model.

For ease of illustration, the following description uses the Ethernet device 33a for example. In addition, elements in the Ethernet device 33b similar to that of the Ethernet device 33a are labeled with equal or similar reference numerals, and thus further description thereon will be omitted herein. As shown in FIG. 4, the Ethernet device 33a further includes an error correction code encoder 345a (ECC encoder) coupled between the MAC 343a and the PHY 341a, and the error correction code encoder 345a is used for encoding a first packet P1 outputted from the MAC 343a to generate a second packet P2 to the PHY 341a. Similarly, the Ethernet device 33a further includes an error correction code decoder 347a (ECC decoder) also coupled between the MAC 343a and the PHY 341a, and the error correction code decoder 347a is used for decoding a third packet P3 outputted from the PHY 341a to generate a fourth packet P4 to the MAC 343a.

For example, before a 4-byte packet (i.e., a first packet P1) from the MAC 343a is sent to the PCS of the PHY 341a, an error correction code encoder 345a encodes the 4-byte packet into a 5-byte packet (i.e., a second packet P2) to increase the rate from 1 Gbps to 1.25 Gbps. Conversely, before a 5-byte packet (i.e., a third packet P3) from the PHY 341a is sent to the MAC 343a, an error correction code decoder 347a decodes the 5-byte packet to a 4-byte packet (i.e., a fourth packet P4) to decrease the rate from 1.25 Gbps to 1 Gbps.

As mentioned above, a person of ordinary skill in the art may appreciate that the main object of the embodiment is to add the error correction code to the redundant bandwidths so that these redundant bandwidths are not wasted, and the error correction code encoder 345a and the error correction code decoder 347a are also applied to the Ethernet device 33b so that the present disclosure may further implement a detection and correction ability of the MACs 343a, 343b of the two Ethernet devices 33a, 33b to efficiently reduce the bit error rate of the transmission channel, and to further increase the performance of the two Ethernet devices 33a, 33b.

Furthermore, in an application of the present disclosure, the error correction code may be any kind of linear block codes. For example, a BCH code, which is a linear block code, can be adopted. The error correction code encoder 345a performs an encoding calculation based on a linear block code, and the error correction code decoder 347a performs a decoding calculation based on the linear block code. The linear block code is a BCH(n, k) code. In this embodiment, the error correction code encoder 345a performs the encoding calculation based on the BCH(n, k) code, and the error correction code decoder 347a performs the decoding calculation based on the BCH(n, k) code, with n representing the bit numbers of packets after encoding (or before decoding), and k representing the bit numbers of packets before encoding (or after decoding). However, the encoding calculation or the decoding calculation based on the BCH(n, k) code should be known by persons of ordinary skill in the art, and therefore further details thereon will be omitted herein.

Figure 5A:
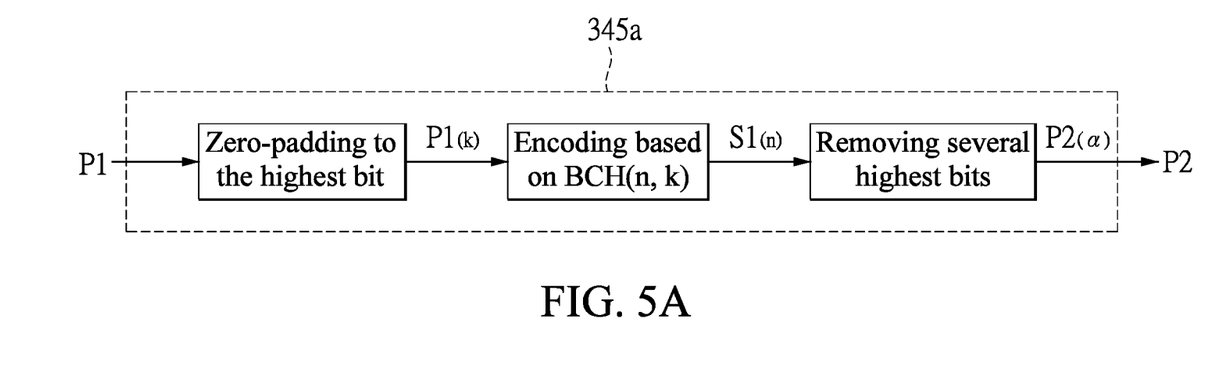
FIG. 5A shows a diagram of an encoding calculation performed by the error correction code encoder in FIG. 4 according to an exemplary embodiment of the present disclosure.
Figure 5B:
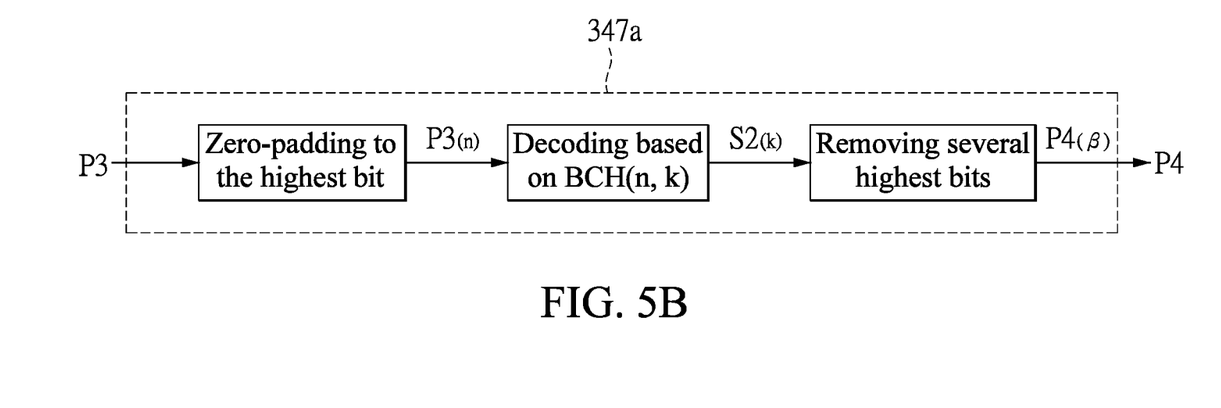
FIG. 5B shows a diagram of a decoding calculation performed by the error correction code decoder in FIG. 4 according to an exemplary embodiment of the present disclosure.

It should be noted that, according to the prior art, both the bit numbers of the packets from the PHY 341a and the bit numbers of the packets from the MAC 343a would not be equal to the values of the aforementioned n and k. Therefore, in the embodiment of the present disclosure, an additional code length shortening mechanism need be used to implement the encoding calculation or the decoding calculation based on the BCH(n, k) code. Furthermore, reference is also made to both FIG. 5A and FIG. 5B for detailed description, which show diagrams respectively used for illustrating the encoding/decoding calculation performed by the error correction code encoder in FIG. 4 and the error correction code decoder in a preferred embodiment. It should be noted that, the embodiments shown in FIG. 5A and FIG. 5B are used only as an example, and the present disclosure is not limited thereto. In addition, certain elements in FIG. 5A and FIG. 5B that are similar to those in FIG. 4 are labeled with the same reference numerals, and thus further detail will be omitted herein.

In the embodiment shown in FIG. 5A, the error correction code encoder 345a first performs zero-padding to highest bits of the first packet P1 to generate the first packet P1 having k bits, and encodes the first packet P1 having k bits as a first sequence S1 having n bits by performing the encoding calculation based on the BCH(n, k) code. Next, the error correction code encoder 345a removes highest bits of the first sequence S1 having n bits to generate the second packet P2 having $\alpha$ bits.

In the embodiment shown in FIG. 5B, the error correction code decoder 347a first performs zero-padding on highest bits of the third packet P3 to generate the third packet P3 having n bits, and decodes the third packet P3 having n bits as a second sequence S2 having k bits by performing the decoding calculation based on the BCH(n, k) code. Next, the error correction code decoder 347a removes highest bits of the second sequence S2 having k bits to generate the fourth packet P4 having $\beta$ bits.

It should be noted that, the aforementioned $\alpha$ and $\beta$ respectively represent the bit numbers of the packets to be inputted to the PHY 341a and the MAC 343a, but $\alpha$ and $\beta$ in the present disclosure are not limited to specific values. For example, when a 32-bit packet of the MAC 343a is sent to the PCS of the PHY 341a (i.e., the first packet P1 outputted from the MAC 343a has 32 bits, for example, $P1_{(32)}=[b_1, b_2, \ldots, b_{31}, b_{32}]$), and under the circumstance that the error correction code encoder 345a performs the encoding calculation based on the BCH(63, 57) code (i.e., n is 63, and k is 57), the error correction code encoder 345a adds 25 zeros to the highest bits of the original first packets $P1_{(32)}$ to form the first packet $P1_{(57)}$ having 57 bits (for example, $P1_{(57)} = [0_1, 0_2, \ldots, 0_{24}, 0_{25}, b_1, b_2, \ldots, b_{31}, b_{32}]$).

Next, the error correction code encoder 345a performs the encoding calculation based on the BCH(63, 57) code the first packet $P1_{(57)}$ having 57 bits to generate a first sequence $S1_{(63)}$ having 63 bits. According to the decoding based on the BCH(63, 57) code, all of the highest 25 bits in the first sequence $S1_{(63)}$ must be zero. Therefore, the error correction code encoder 345a may directly remove the first 23 highest bits in the first sequence $S1_{(63)}$ afterwards to generate a first sequence $S1_{(40)}$ only having 40 bits as the second packet P2 to be transmitted to the PHY 341a so as to increase the rate from 1 Gbps to 1.25 Gbps. In other words, α is 40 in the example mentioned above.

On the other hand, it is assumed that when a 40-bit packet of the PHY 341a is to be sent to the MAC 343a (i.e., the original third packet P3 outputted from the PHY 341a has 40 bits, for example, $P3_{(40)} = [b_1, b_2, \ldots, b_{39}, b_{40}]$) and that the error correction code decoder 347a performs the decoding calculation based on the BCH(63, 57) code. The error correction code decoder 347a first adds 23 zeros to the highest bits of the original third packet $P3_{(40)}$ to generate the third packet $P3_{(63)}$ having 63 bits (for example, $P3_{(63)} = [0_1, 0_2, \ldots, 0_{22}, 0_{23}, b_1, b_2, \ldots, b_{39}, b_{40}]$).

Next, the error correction code decoder 347a performs the decoding calculation based on the BCH(63, 57) code on the third packet P3(63) having 63 bits to generate the second sequence $S2_{(57)}$ having 57 bits. Similarly, according to the encoding of the BCH(63, 57) code, the error correction code decoder 347a may remove the first 25 highest bits in the second sequence $S2_{(57)}$ afterwards to generate the second sequence $P4_{(32)}$ only having 32 bits (i.e., four-byte) as the fourth packet P4 transmitted to the MAC 343a so as to decrease the rate from 1.25 Gbps to 1 Gbps. In other words, β is 32 in the example mentioned above.

It should be further noted that, the specific embodiments mentioned above are only used for example, and are not for limiting the present disclosure. Thus a person of ordinary skill in the art may make changes according to practical requirement. In addition, due to the correctional characteristic of the BCH(63, 57) code, the embodiment may achieve that each four-byte data packet has 1-bit correctional capability. However, for further improving the correctional characteristic mentioned above, it should be appreciated by a person skilled in the art that the error correction code encoder 345a and the error correction code decoder 347a in the embodiment of the present disclosure can also perform the encoding/decoding calculation based on BCH code with greater code length. For example, assuming that the error correction code encoder 345a and the error correction code decoder 347a perform encoding/decoding calculation based on the BCH(127, 113) code, the embodiment may change to implement each eight-byte data having 2-bit correction capability.

For example, when an eight-byte packet (i.e., 64 bits) of the MAC 343a is to be sent to the PCS of the PHY 341a, the error correction code encoder 345a may first pad the 64-bit packet to be a 113-bit packet, and proceed to perform the encoding calculation based on the BCH(127, 113) code to generate a packet having 127 bits, and the error correction code encoder 345a would remove several zero bits from the 127 bits to generate a packet only having 80 bits (i.e., ten-byte) so as to increase the rate from 1 Gbps to 1.25 Gbps.

Similarly, when a ten-byte packet of the PHY 341a is to be sent to the MAC 343a, the error correction code decoder 347a may first pad the 80-bit packet to be a 127-bit packet, and proceed to perform the decoding calculation based on the BCH(127, 113) code to generate a 113-bit packet, and the error correction code decoder 347a removes several zero bits from the 113 bits to generate a packet only having 64 bits so as to decrease the rate from 1.25 Gbps to 1 Gbps. In brief, the detail of this embodiment is similar to that of the embodiment mentioned above, and therefore further detail will be omitted herein.

Figure 6:
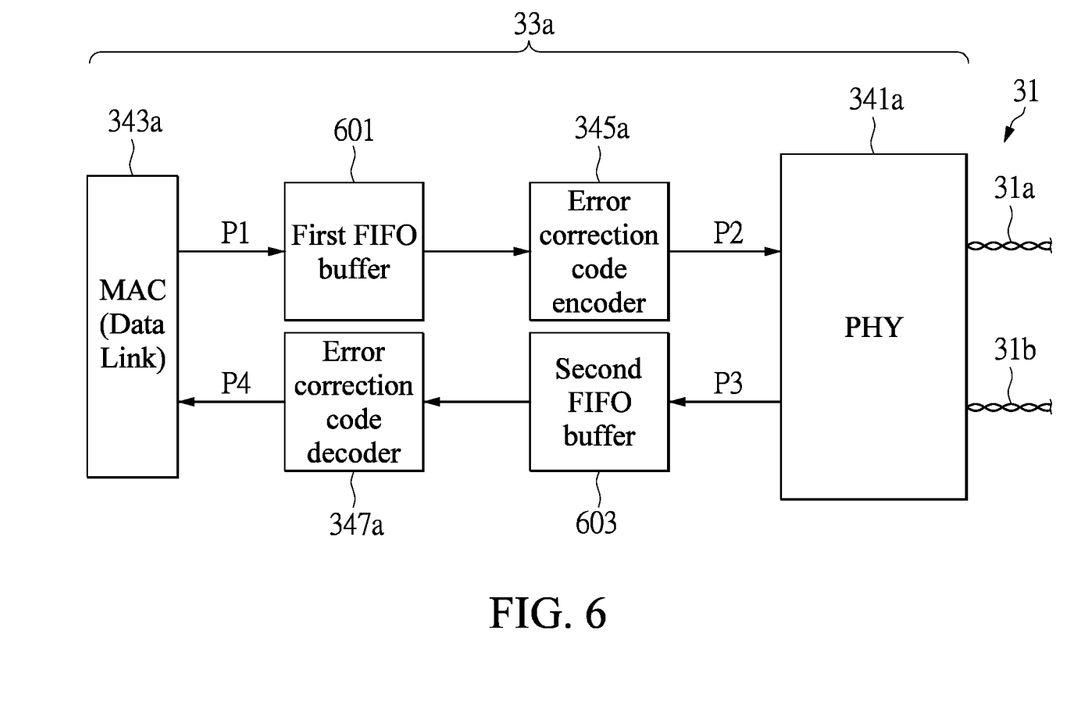
FIG. 6 shows a schematic diagram illustrating the Ethernet device in FIG. 3 being mapped to an open system interconnection (OSI) reference model according to another exemplary embodiment of the present disclosure.

Next, reference is made to FIG. 6, which shows a diagram of the Ethernet device in FIG. 3 being mapped to an OSI reference model in another preferred embodiment. For ease of illustration, only the Ethernet device 33a is used for example in FIG. 6.

Obviously, compared to the embodiment in FIG. 4, the Ethernet device 33a in FIG. 6 further includes a first first-in-first-out (FIFO) buffer 601 and a second FIFO buffer 603. The first FIFO buffer 601 is coupled between the MAC 343a and the error correction code encoder 345a, and the second FIFO buffer 603 is coupled between the PHY 341a and the error correction code decoder 347a.

In detail, the Ethernet device 33a may first use the first FIFO buffer 601 to store the first packet P1 from the MAC 343a, and when the first packet P1 stored in the first FIFO buffer 601 has β bits, the Ethernet device 33a uses the error correction code encoder 345a to encode the first packet P1. When the first packet P1 stored in the first FIFO buffer 601 does not have β bits, the Ethernet device 33a first performs zero-padding on the lowest bits of the first packet P1 stored in the first FIFO buffer 601 to generate the first packet P1 having β bits, and then the Ethernet device 33a uses the error correction code encoder 345a to encode the first packet P1.

Similarly, the Ethernet device 33a may first use the second FIFO buffer 603 to store the third packet P3 from the PHY 341a, and when the third packet P3 stored in the second FIFO buffer 603 has α bits, the Ethernet device 33a uses the error correction code decoder 347a to decode the third packet P3. When the third packet P3 stored in the second FIFO buffer 603 does not have α bits, the Ethernet device 33a first performs zero-padding on the lowest bits of the third packet P3 stored in the second FIFO buffer 603 to generate the third packet P3 having α bits, and then the Ethernet device 33a uses the error correction code decoder 347a to decode the third packet P3.

In this way, in the example of the four-byte packet and the five-byte packet, when the packet end of the first packet P1 stored in the first FIFO buffer 601 is insufficient to form four-byte units for the Ethernet device 33a, the Ethernet device 33a adds several zero bits to the packet end of the first packet P1 stored in the first FIFO buffer 601 to form four-byte units, and then the error correction code encoder 345a is inputted to perform the process in FIG. 5A.

Similarly, when the packet end of the third packet P3 stored in the second FIFO buffer 603 is insufficient to form five-byte units for the Ethernet device 33a, the Ethernet device 33a adds several zero bits to the packet end of the third packet P3 stored in the second FIFO buffer 603 to form five-byte units, and then the error correction code decoder 347a is inputted to perform the process in FIG. 5B.

Since the error correction code encoder 345a and the error correction code decoder 347a performing the processes shown in FIG. 5A and FIG. 5B are described above, further details thereon will be omitted herein. In brief, the embodiment of the present disclosure may further provide a buffering mechanism to maintain the rate ratio of the MAC 343*a* to the PHY 341*a* at 4:5 by adjusting the length of the packet end stored in the buffer.

In summary, the Ethernet connection method and the Ethernet device thereof provided by the embodiment of the present disclosure may be applied to provide a connection mode that avoids connection failure or being forced to use the 100Base-TX/10Base-T standards to transmits data when only one twisted pair or two twisted pairs in an Ethernet wire can be used to transmit data. In addition, an error correction code mechanism is added between the PHY and the MAC when the Ethernet device operates in the aforementioned connection mode, solving the problem of wasting redundant bandwidth.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. An Ethernet connection method used for an Ethernet device having a media access control layer and a physical layer, the connection method comprising a step of:
   setting the Ethernet device, by a controller of the Ethernet device, to operate in a first connection mode or a second connection mode;
   wherein the first connection mode uses four twisted pairs of an Ethernet wire, and the second connection mode uses one twisted pair or two twisted pairs of the Ethernet wire, and when the Ethernet device operates in the second connection mode, an error correction code (ECC) mechanism is added between the media access control layer and the physical layer.

2. The connection method of claim 1, wherein the step of setting the Ethernet device, by the controller of the Ethernet device, to operate in the first connection mode or the second connection mode further includes steps of:
   setting the Ethernet device to operate in the first connection mode; and
   determining whether to reset the Ethernet device to make the Ethernet device operate in the second connection mode according to a connection status in the first connection mode.

3. The connection method of claim 2, wherein the connection status is a number of failed connections of the Ethernet device, and when the number of failed connections of the Ethernet device is greater than a predetermined number, the Ethernet device is determined to operate in the second connection mode.

4. The connection method of claim 2, wherein the connection status is obtained through an auto-negotiation process, and when the resolved connection status corresponds to one twisted pair or two twisted pairs of the Ethernet wire, the Ethernet device is determined to operate in the second connection mode.

5. The connection method of claim 2, wherein the connection status is obtained through a signal detection on the Ethernet wire, and when no valid signal on any one of the four twisted pairs of the Ethernet wire is detected, the Ethernet device is determined to operate in the second connection mode.

6. The connection method of claim 1, wherein the Ethernet device further includes an error correction code encoder coupled between the media access control layer and the physical layer, and the error correction code encoder is used to encode a first packet outputted from the media access control layer to generate a second packet to the physical layer.

7. The connection method of claim 6, wherein the error correction code encoder performs an encoding calculation based on a linear block code.

8. The connection method of claim 7, wherein the linear block code is a BCH(n, k) code, and the encoding calculation further includes steps of:
   performing zero-padding on highest bits of the first packet to generate the first packet having k bits, and performing the encoding calculation based on the BCH(n, k) code on the first packet having k bits to encode the first packet as a first sequence having n bits; and
   removing highest bits of the first sequence having n bits to generate the second packet having $\alpha$ bits, wherein $\alpha$ represents a bit number of packets to be inputted into the physical layer.

9. The connection method of claim 8, wherein the Ethernet device further includes an error correction code decoder coupled between the media access control layer and the physical layer, and the error correction code decoder is used for decoding a third packet outputted from the physical layer to generate a fourth packet to the media access control layer.

10. The connection method of claim 9, wherein the error correction code decoder performs a decoding calculation based on the BCH(n, k) code, and the decoding calculation further includes steps of:
    performing zero-padding on highest bits of the third packet to generate the third packet having n bits, and performing the decoding calculation based on the BCH(n, k) code on the third packet having n bits to decode the third packet as a second sequence having k bits; and
    removing highest bits of the second sequence having k bits to generate the fourth packet having $\beta$ bits, wherein $\beta$ represents the bit number of packets to be inputted into the media access control layer.

11. An Ethernet device connected to a remote network device by an Ethernet wire, the Ethernet device comprising:
    a first transceiver coupled to a first twisted pair of the Ethernet wire;
    a second transceiver coupled to a second twisted pair of the Ethernet wire; and
    a controller used for setting the Ethernet device to operate in a first connection mode or a second connection mode;
    wherein four twisted pairs of the Ethernet wire are used in the first connection mode, and the first twisted pair and/or the second twisted pair of the Ethernet wire are used in the second connection mode, and when the Ethernet device operates in the second connection mode, an error correction code mechanism is added between a media access control layer and a physical layer of the Ethernet device.

12. The Ethernet device of claim 11, wherein the controller performs the following steps to set the Ethernet device to operate in the first connection mode or the second connection mode:
    setting the Ethernet device to operate in the first connection mode; and
    determining whether to reset the Ethernet device to make the Ethernet device operate in the second connection mode according to a connection status in the first connection mode.

13. The Ethernet device of claim 12, wherein the connection status is a number of failed connections of the Ethernet device, and when the number of failed connections of the Ethernet device is greater than a predetermined number, the Ethernet device is determined to operate in the second connection mode.

14. The Ethernet device of claim 12, wherein the connection status is obtained through an auto-negotiation process, and when the resolved connection status corresponds to one twisted pair or two twisted pairs of the Ethernet wire, the Ethernet device is determined to operate in the second connection mode.

15. The Ethernet device of claim 12, wherein the connection status is obtained through a signal detection on the Ethernet wire, and when no valid signal on any one of the four twisted pairs of the Ethernet wire is detected, the Ethernet device is determined to operate in the second connection mode.

16. The Ethernet device of claim 11, wherein the Ethernet device further includes an error correction code encoder coupled between the media access control layer and the physical layer, and the error correction code encoder is used for encoding a first packet outputted from the media access control layer to generate a second packet to the physical layer.

17. The Ethernet device of claim 16, wherein the error correction code encoder performs an encoding calculation based on a linear block code.

18. The Ethernet device of claim 17, wherein the linear block code is a BCH(n, k) code, and the encoding calculation further includes steps of:

performing zero-padding on highest bits of the first packet to generate the first packet having k bits, and performing the encoding calculation based on the BCH(n, k) code on the first packet having k bits to encode the first packet as a first sequence having n bits; and removing highest bits of the first sequence having n bits to generate the second packet having $\alpha$ bits, wherein $\alpha$ represents a bit number of packets to be inputted into the physical layer.

19. The Ethernet device of claim 18, wherein the Ethernet device further includes an error correction code decoder coupled between the media access control layer and the physical layer, and the error correction code decoder is used for decoding a third packet outputted from the physical layer to generate a fourth packet to the media access control layer.

20. The Ethernet device of claim 19, wherein the error correction code decoder performs a decoding calculation based on the BCH(n, k) code, and wherein the decoding calculation further includes steps of:

performing zero-padding on highest bits of the third packet to generate the third packet having n bits, and performing the decoding calculation based on the BCH (n, k) code on the third packet having n bits to decode the third packet as a second sequence having k bits; and removing highest bits of the second sequence having k bits to generate the fourth packet having $\beta$ bits, wherein $\beta$ represents the bit number of packets to be inputted into the media access control layer.

* * * * *